(12) United States Patent
Foote et al.

(10) Patent No.: US 6,903,007 B1
(45) Date of Patent: Jun. 7, 2005

(54) PROCESS FOR FORMING BOTTOM ANTI-REFLECTION COATING FOR SEMICONDUCTOR FABRICATION PHOTOLITHOGRAPHY WHICH INHIBITS PHOTORESIST FOOTING

(75) Inventors: David K. Foote, San Jose, CA (US); Minh Van Ngo, Union City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 900 days.

(21) Appl. No.: 08/857,055

(22) Filed: May 15, 1997

Related U.S. Application Data

(63) Continuation-in-part of application No. 08/479,718, filed on Jun. 7, 1995, now Pat. No. 5,710,067.

(51) Int. Cl.$^7$ .................................. H01L 21/4763
(52) U.S. Cl. .................. 438/636; 438/763; 438/769; 438/770; 438/775; 438/786; 438/791
(58) Field of Search ............................... 438/636, 763, 438/769, 770–778, 786–792

(56) References Cited

U.S. PATENT DOCUMENTS

| | | | | |
|---|---|---|---|---|
| 5,554,570 A | * | 9/1996 | Maeda et al. ............... | 438/763 |
| 5,672,523 A | * | 9/1997 | Yamamoto et al. .......... | 438/396 |
| 5,821,603 A | * | 10/1998 | Puntambekar ............... | 257/640 |
| 5,888,855 A | * | 3/1999 | Nagahisa et al. ........... | 438/786 |
| 5,918,147 A | * | 6/1999 | Filipiak et al. ............. | 438/636 |

OTHER PUBLICATIONS

Wolf, Silicon Processing for the VLSI ERA, vol. 1, p. 427, 1989.*
Wolf, Silicon Processing for the VLSI ERA, vol. 1, p. 427, 441, 1989.*
Dielectric Antireflective coatings for DUV lithography Christopher Bencher, et al. Solid State Technology, pp. 109–114, Mar. 1997.

* cited by examiner

*Primary Examiner*—Tuan H. Nguyen
*Assistant Examiner*—Thanh Nguyen

(57) ABSTRACT

An anti-reflective coating is formed between a material layer which is to be patterned on a semiconductor structure using photolithography, and an overlying photoresist layer. The anti-reflective coating suppresses reflections from the material layer surface into the photoresist layer that could degrade the patterning. The anti-reflective coating includes an anti-reflective layer of silicon oxime, silicon oxynitride, or silicon nitride, and a barrier layer which is grown on the anti-reflective layer using a nitrous oxide plasma discharge to convert a surface portion of the anti-reflective layer into silicon dioxide. The barrier layer prevents interaction between the anti-reflective layer and the photoresist layer that could create footing. The anti-reflective layer is deposited on the material layer using Plasma Enhanced Chemical Vapor Deposition (PECVD) in a reactor. The barrier layer is grown on the anti-reflective layer in-situ in the same reactor, thereby maximizing throughput.

23 Claims, 10 Drawing Sheets

PROCESS FOR FORMING BOTTOM ANTI-REFLECTION COATING FOR SEMICONDUCTOR FABRICATION PHOTOLITHOGRAPHY WHICH INHIBITS PHOTORESIST FOOTING

CROSS-REFERENCE TO RELATED APPLICATION

This application is a continuation-in-part of U.S. patent application Ser. No. 08/479,718, filed Jun. 7, 1995, entitled "SILICON OXIME FILM", by David K. Foote et al, now U.S. Pat. No. 5,710,067, issued Jan. 20, 1998.

BACKGROUND OF THE INVENTION

1. Field of the Invention

The present invention generally relates to the art of microelectronic integrated circuits, and more specifically to a process for forming a bottom anti-reflection coating for semiconductor fabrication photolithography which inhibits photoresist footing.

2. Description of the Related Art

Photolithography is a semiconductor fabrication process that is widely used. for patterning material layers on a semiconductor wafer or structure. The material layers can be non-metal (e.g. silicon, polysilicon), metal (e.g. aluminum), etc.

A layer of photoresist is formed over the material layer to be patterned, and exposed to light through a mask which has opaque and transparent areas corresponding to the desired pattern. Light passing through the transparent areas in the mask causes a chemical reaction in the underlying areas of the photoresist such that these areas will be dissolved away when the wafer is exposed to a developing solution.

The result is a photoresist layer having openings therethrough which correspond to the transparent areas of the mask. The patterned photoresist layer is then used as an etch mask such that areas of the material layer which are exposed by the openings in the photoresist layer will be selectively removed upon exposure to an appropriate etching solution. This is possible by selecting the etching solution to have a much higher etch rate for the material layer than for the photoresist. Preferably the etch rate for the photoresist will be substantially zero.

With feature sizes of integrated circuits constantly shrinking, photolithographic resolution or definition is becoming increasingly sensitive to reflection during the light exposure step. This is especially problematic at very short wavelengths in the ultraviolet band, including deep ultraviolet exposure which is conventionally performed at a wavelength of 248 nanometers.

As illustrated in FIG. 1, a semiconductor structure 10 which is in an intermediate step in a fabrication process includes a material layer 12 which is to be patterned by photolithography, and a photoresist layer 14 which is formed on the material layer 12. The material layer 12 can be polysilicon which is being patterned into a field effect transistor gate or interconnect, or any other applicable material. The layer 12 is formed on a silicon or other semiconductor substrate which is not shown.

A ray of light is illustrated as entering the photoresist layer 14 at an off-normal angle as indicated at 16, and passing through the layer 14 as indicated at 18. The ray is reflected from the surface of the layer 12 back into the layer 14 as indicated at 20. The reflected ray 20 enlarges the exposed area of the photoresist layer 14 to include an area that was not intended to be exposed, resulting in a larger area being removed during development than was desired.

This phenomenon in general degrades the resolution or definition capability of the photolithographic process. Although FIG. 1 illustrates only unwanted reflection caused by-off-normal incident light, light can also be reflected off underlying device features to produce similar results.

In order to inhibit reflection of light back into a photoresist layer, Bottom Anti-Reflective Coatings (BARC) have been developed as illustrated in FIG. 2, in which similar elements are designated by the same reference numerals used in FIG. 1. As viewed in the figure, an anti-reflective coating 22 is provided between the material layer 12 and the photoresist layer 14

A ray of light is incident on and passes through the photoresist layer 14 as indicated at 16,18, and a portion of this light is reflected back into the photoresist layer 14 as indicated at 20. Another portion, of this light passes through the anti-reflective coating 22 as indicated at 24, is reflected from the surface of the layer 12, and passes back through the layer 22 into the layer 14 as indicated at 26.

The index of refraction n, extinction coefficient k, and thickness t of the anti-reflective coating 22 are selected such that the light 26 will be 180° or ½ wavelength out of phase with the light 20. Destructive interference will occur between the light 20,26 in the photoresist layer 14 causing the light 20,26 to mutually cancel. In this manner, reflection of light from the surface of the material layer 12 into the photoresist layer 14 is effectively inhibited.

An anti-reflective layer or coating 22 which is effective for deep ultraviolet lithography is described in U.S. patent application Ser. No. 08/479,718, entitled "SILICON OXIME FILM", filed Jun. 7, 1995, by D. Foote, and is incorporated herein by reference in its entirety. This coating is formed using Plasma Enhanced Chemical Vapor Deposition (PECVD) over the material layer to be patterned as described above.

The material of the coating is called silicon oxime, and has the generic chemical formulation SiNO:H, being a compound of silicon, oxygen, nitrogen, and residual hydrogen in varying proportions which are selected in accordance with a particular application. The index of refraction n, extinction coefficient k, and thickness t of the layer are selected to provide half-wavelength cancellation of light reflected into an overlying photoresist layer 14 as described above.

FIG. 3 illustrates the desired appearance of the structure 10 after a portion of the photoresist layer 14 has been exposed and developed to form an opening 14'. The layer 14 acts as an etch mask for subsequent processing such that the portions of the layer 22 and layer 12 underlying the opening 14' can be selectively removed by etching using a substance that will not significantly affect the photoresist layer 14. The walls of the opening 14 are substantially vertical as desired.

FIG. 4 is similar to FIG. 3, but illustrates "footing" which is caused by chemical interaction between the anti-reflective layer 22 and the photoresist layer 14. The footing appears as horizontally enlarged portions 22' which extend from the lower edges of the photoresist layer 14 into the opening 14'. The footing is undesirable because it degrades the resolution or definition of the photolithographic process.

Where the anti-reflective layer 22 is formed of silicon oxime as described above, the footing is caused by chemical interaction between amines (hydrogen-nitrogen bonds) in the silicon oxime layer 22 and the material of the photoresist layer. This is facilitated by the fact that silicon oxime is a base, whereas the photoresist material is an acid.

It is known that this interaction, and thereby the footing, can be inhibited by forming a silicon dioxide barrier layer on the surface of the silicon oxime layer before forming the photoresist thereon. The barrier layer acts as a seal or cap which separates the amines in the silicon oxime layer from the photoresist layer 14.

Prior art methods include forming a silicon dioxide barrier layer on a silicon oxynitride (SiON:H) layer, which is another substance used as an antireflection coating. This method includes deposition in the reactor used to form the silicon oxynitride layer itself. Such deposition is limited by conventional techniques to forming a silicon dioxide layer having a thickness in excess of 100 angstroms. A silicon dioxide layer of such thickness is difficult to remove if required in the processing environment to which the present invention relates.

Another method includes growing a silicon dioxide layer on a silicon oxime layer in a downstream plasma system using oxygen gas. This method is limited in that it is only capable of forming a silicon dioxide layer which is too thin (less than 10 angstroms) to eliminate footing.

FIG. 6 illustrates a detrimental situation which can result from removing a thick (100 angstroms or more) silicon dioxide barrier layer from a field-effect transistor structure. An exemplary semiconductor structure 30 includes a silicon substrate 32. A thin gate oxide layer 34 is formed on the substrate 32, and a polysilicon gate 36 is formed on the gate oxide. The gate 36 was photolithographically patterned, and had a silicon oxime layer, a 100+ angstrom silicon dioxide layer, and a photoresist layer formed thereon which were removed after the patterning was completed.

The silicon dioxide barrier layer was removed using a suitable etchant. In this configuration, the lateral edges of the gate oxide layer 34 were also exposed to the etchant. During the length of time required to remove the silicon dioxide layer, exposed edge portions of the layer 34 were also removed by the etchant to produce significant undercutting as indicated at 34'. This adversely affects the gate width of the transistor and the control over the underlying channel by a voltage applied to the gate 36.

As described in the above referenced U.S. Pat. No. 5,710,067, the escalating requirements for high density and performance associated with ultra large scale integration require responsive changes in conductive patterns, which is considered one of the most demanding aspects of ultra large scale integration technology. High density demands for ultra large scale integration semiconductor wiring require increasingly denser arrays with minimal spacing between conductive lines. The increasing demands for high densification impose correspondingly high demands on photolithographic techniques.

Conventional photolithographic techniques employed during various phases in the manufacture of semiconductor devices involve the formation of an anti-reflective coating (ARC), also characterized as an anti-reflective layer (ARL), typically positioned between a semiconductor substrate and a photoresist material. ARCs are conventionally made of various materials, including organic and inorganic. For example, inorganic materials conventionally employed for ARCs include silicon nitride, silicon oxynitride, α-carbon, titanium nitride, silicon carbide and amorphous silicon. Organic materials conventionally employed for ARCs include spin-on polyimides and polysulfones. Conventional ARCs are designed, by appropriate adjustment of variables such as composition, deposition conditions and reaction conditions, to exhibit the requisite optical parameters to suppress multiple interference effects caused by the interference of light rays propagating in the same direction due to multiple reflections in the photoresist film. The effective use of an ARC enables patterning and alignment without disturbance caused by such multiple interference, thereby improving line width accuracy and alignment, critical factors with respect to achieving fine line conductive patterns with minimal interwiring spacing. The use of an ARC is particularly significant when forming a via or contact hole over a stepped area, as when etching a dielectric layer deposited on a gate electrode and gate oxide formed on a semiconductor substrate in manufacturing a field effect transistor.

The physics involved in ARCs is known and the use of ARCs is conventional and, hence, will not be set forth herein detail. See, for example, T. Tanaka et al., "A New Photolithography Technique with Antireflective Coating on Resist: ARCOR," J. Electrochem. Soc., Vol. 137, No. 12, December 1990, pp. 3900–3905. ARCs have improved the accuracy of ultra-violet and deep ultra-violet lithography, and expanded to the use of ion beam, I-line, KrF and ArF excimer laser lithography. T. Ogawa et al., "SiO$_x$N$_y$:H, high performance anti-reflective layer for current and future optical lithography." Recently, an effort has been made to develop improved dry etching techniques for ARCs, including particularly silicon oxynitride. M. Armacost et al., "Selective Oxide: Nitride Dry Etching in a High Density Plasma Reactor," Electrochemical Society Meeting, 1993, Extended Abstract, column 93-1, p. 369. Efforts have been made to engineer the optical parameters of an ARC, as by adjusting process variables impacting the refractive index during plasma enhanced chemical vapor deposition (PECVD). T. Gocho et al., "Chemical Vapor Deposition of Anti-Reflective Layer Film for Excimer Laser Lithography," Japanese Journal of Applied Physics, Vol. 33, January.1994, Pt. 1, No. 1B, pp. 486–490.

Notwithstanding such efforts, conventional photolithographic capabilities constitute a severe limiting factor in reducing the design rule or maximum dimension of a conductive pattern and, hence, increasing densification.

Accordingly, there exists a need for materials having the requisite optical properties for use in ARCs which enable accurate control of the width of conductive lines of conductive patterns and minimizing the interwiring spacing therebetween, particularly for materials which exhibit desirable etch characteristics.

SUMMARY OF THE INVENTION

The present invention overcomes the drawbacks of the prior art by providing a process by which a thin silicon dioxide barrier layer can be formed on a silicon oxime, silicon oxynitride, or silicon nitride anti-reflective layer. A barrier layer formed in accordance with the present invention is thick enough to inhibit interaction between the anti-reflective layer and an overlying photoresist layer and thereby prevent footing, but thin enough to be removed without causing undercutting of a gate oxide layer as described above.

In accordance with the present invention, an anti-reflective coating is formed between a material layer which is to be patterned on a semiconductor structure using photolithography, and an overlying photoresist layer. The anti-reflective coating suppresses reflections from the material layer surface into the photoresist layer that could degrade the patterning.

The anti-reflective coating includes an anti-reflective layer of silicon. oxime (SiNO:H), silicon oxynitride (SiON:H), or silicon nitride. ($Si_3N_4$:H), and a barrier layer which is grown on the anti-reflective layer using a nitrous oxide plasma discharge to convert a surface portion of the anti-reflective layer into silicon dioxide.

The barrier layer prevents interaction between the anti-reflective layer and the photoresist layer that could create footing. The anti-reflective layer is deposited on the material layer using Plasma Enhanced Chemical Vapor Deposition (PECVD) in a reactor. The barrier layer is grown on the anti-reflective layer in-situ in the same reactor, thereby maximizing throughput.

The present barrier layer is not formed by deposition as in the prior art. Instead, the barrier layer is grown by bombardment of the anti-reflective layer by ion species from the nitrous oxide plasma such that a portion of the surface of the anti-reflective layer is consumed by the reaction and converted into silicon dioxide. This enables the barrier layer to be grown to a thickness on the order of 10 to 40 (more preferably 15 to 25) angstroms, which is substantially thinner than can be formed by deposition of silicon dioxide (100 angstroms or more).

An object of the present invention is a material having optical properties suitable for use as an ARC.

Another object of the present invention is a material which exhibits high etch selectivity with respect to conventional dielectric materials employed in manufacturing semiconductor devices.

According to the present invention, the foregoing and other objects are achieved in part by a film comprising silicon oxime having the formula $Si_{(1-x+y+z)}NxO:H_z$, wherein x, y and z represent the atomic percentage of nitrogen, oxygen and hydrogen, respectively.

Another aspect of the present invention is a semiconductor device having a conductive wiring pattern comprising a plurality of layers including a layer comprising silicon oxime having the formula $Si_{(1-x+y+z)}NxO:H_z$.

A further aspect of the present invention is a semiconductor device having an insulating layer comprising a plurality of layers including a layer comprising silicon oxime having the formula $Si_{(1-x+y+z)}NxO:H_z$.

Another aspect of the invention is a method of forming a film comprising silicon oxime, which method comprises depositing a layer of silicon oxime having the formula $Si_{(1-x+y+z)}NxO:H_z$ on a substrate by PECVD.

A further aspect of the present invention is a method of manufacturing a semiconductor device, which method comprises depositing a layer of silicon oxime having the formula $Si_{(1-x+y+z)}NxO:H_z$ by PECVD on a substrate under dynamic, non-equilibrium conditions in the presence of a stoichiometric excess of nitrogen sufficient to substantially prevent bonding between silicon atoms and oxygen atoms.

These and other features and advantages of the present invention will be apparent to those skilled in the art from the following detailed description, taken together with the accompanying drawings, in which like reference numerals refer to like parts.

DETAILED DESCRIPTION OF THE INVENTION

FIGS. 5a to 5h illustrate a process for patterning a material layer using a anti-reflective layer or coating which is formed in accordance with the present invention.

Figure 5A:
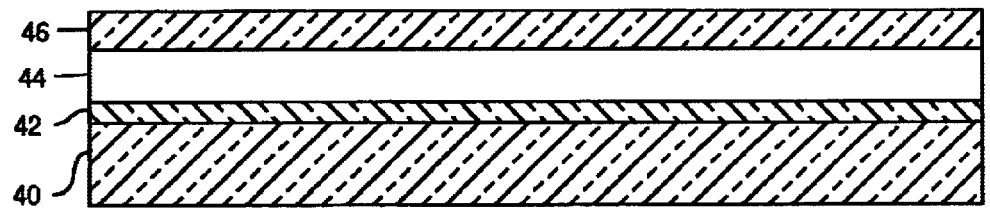
FIGS. 5a to 5h are sectional views illustrating a process according to the present invention.

FIG. 5a illustrates a semiconductor structure at an intermediate step in the overall fabrication process, including a silicon substrate 40, a gate oxide layer 42 formed on the substrate 40, a polysilicon material layer 44 formed on the gate oxide layer 42, and an anti-reflective layer 46 formed on the polysilicon layer 44.

In the illustrated example, the polysilicon layer 44 is to be patterned to form a conductive gate for a field-effect transistor using photolithography. However, the present invention is not so limited, and can be applied to patterning any suitable semiconductor, metal, or other material layer.

The anti-reflective layer 46 is preferably formed of silicon oxime (SiNO:H), silicon oxynitride (SiON:H), or silicon nitride ($Si_3N_4$:H). An anti-reflective layer of any of these materials is suitable for deep ultraviolet (DUV) photolithography at a wavelength of typically 248 nanometers, or more conventional i-line ultraviolet photolithography at longer wavelengths.

In a preferred embodiment of the present invention, the anti-reflective layer 46 is formed of silicon oxime in a Plasma Enhanced Chemical Vapor Deposition (PECVD) reactor to a thickness t of approximately 200 to 400, preferably 300 angstroms. The values of refractive index n and extinction coefficient k for the anti-reflective layer 46 are optimized for DUV photolithography at a wavelength of 248 nanometers. Preferred values of these parameters are n=2.1 to 2.2, and k=0.5 to 0.7. The relative proportions of silicon, oxygen and nitrogen in the. anti-reflective layer 46 are selected to produce these values.

Figure 5B:
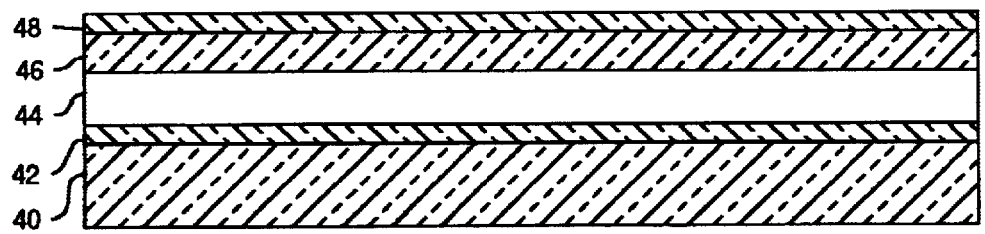

In FIG. 5b, a silicon dioxide barrier layer 48 is grown on the anti-reflective layer 46 using.a nitrous oxide ($N_2O$) plasma discharge to convert .a surface portion of the anti-reflective layer into silicon dioxide. This step is performed in-situ in the same PECVD reactor that was used to form the anti-reflective layer 46, thereby maximizing process throughput.

After formation of the anti-reflective layer 46, the container or chamber of the reactor is pumped down for typically 10 seconds, and then nitrous oxide gas is pumped into the container. RF power is applied to initiate and sustain a plasma in the gas which causes bombardment of the silicon oxime anti-reflective layer 46 by ion species from the nitrous oxide plasma such that a portion of the surface of the layer 46 is consumed by the reaction and converted into silicon dioxide.

The plasma growth process is continued for approximately 20 seconds which enables the silicon dioxide barrier layer 48 to be grown to a thickness on the order of 10 to 40 (more preferably 15 to 25) angstroms.

Figure 5C:
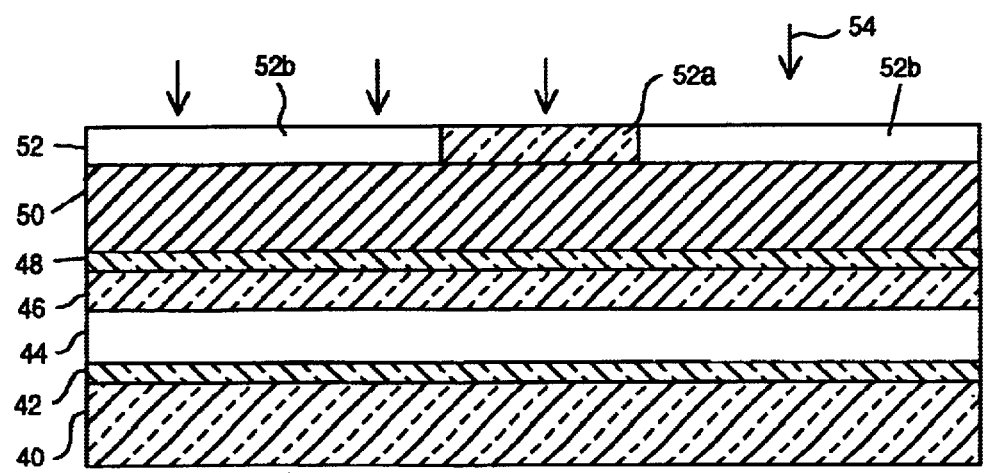

In FIG. 5c, a photoresist layer 50 is formed on the barrier layer 48, and a photolithographic mask 52 is positioned above or in contact with the photoresist layer 50. The mask 52 has an opaque area 52a which corresponds to the gate of the field-effect transistor, and transparent areas 52b. The photoresist layer 50 is optically imaged or exposed through the mask 52 such that a chemical reaction occurs in the areas of the layer 50 underlying the transparent areas 52b.

Figure 5D:
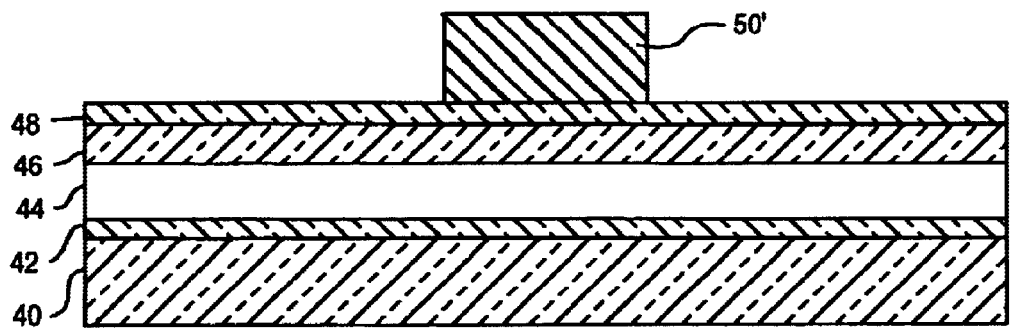

In FIG. 5d, the photoresist layer 50 is developed such that the portions thereof which were exposed to the imaging light are removed by the developing solution. Only a portion 50' of the layer 50 which was masked from the imaging light by the opaque area 52a of the mask 52 remains after development.

Figure 5E:
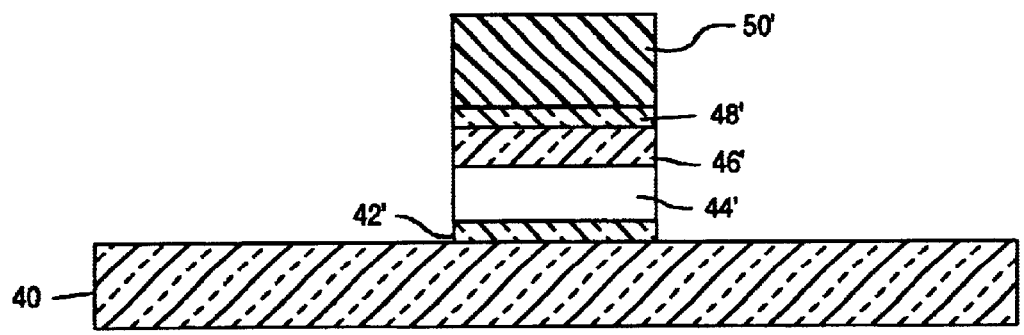

In FIG. 5e, the structure is exposed to an etching substance which has a low etch rate (preferably substantially zero) for the photoresist material, and a substantially high etch rate for the layers 44, 46, and 48. The etching substance is preferably a conventional gaseous mixture of carbon tetraflouride ($CF_4$) and oxygen ($O_2$). The result of this step is that the portions 44' 46' and 48' of the layers 44, 46 and 48 which underlie the photoresist portion 50' are masked or shielded from the etching solution, and the unmasked areas of these layers are removed. This results in patterning of the polysilicon layer 44, as well as the underlying gate oxide layer 42.

The photoresist portion 50' is stripped off in a step 5f to leave the structure as illustrated. Source and drain regions, as well as interconnects, encapsulation, and other elements of the field-effect transistor are formed in subsequent processing steps which are not the subject matter of the present invention and will not be described.

Figure 5F:
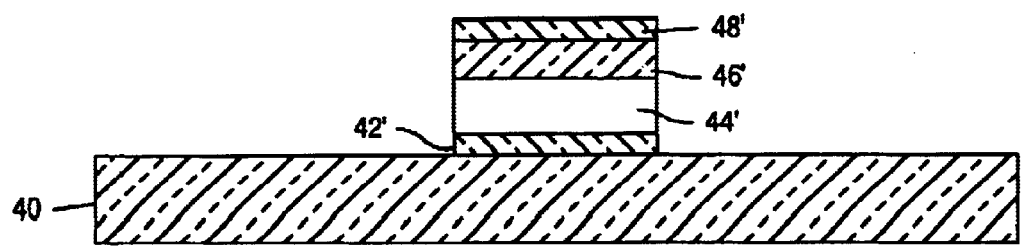

The structure of FIG. 5f can be used per se in applications in which it not necessary to remove the portion 46' of the anti-reflective layer 46 and the portion 48' of the barrier layer. However, the portion 48' of the silicon oxide barrier layer 48 may optionally be removed if required as illustrated in a step of FIG. 5g. This is preferably accomplished by exposure to a solution of hydrofluoric acid (HF) which is optionally followed by exposure to a solution of conventional Sulfuric Peroxide Mixture (SPM). The preferred concentration of hydrofluoric acid is 200:1, and the exposure time is approximately 45 to 60 seconds.

Figure 5G:
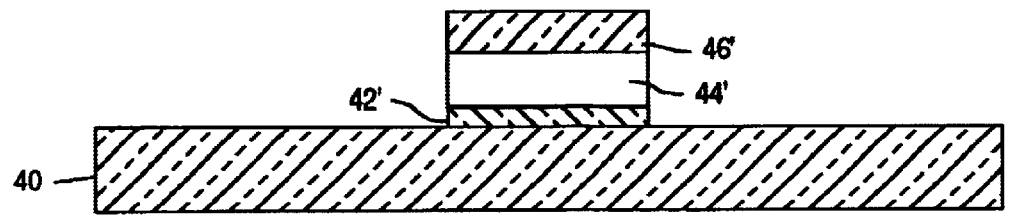
Figure 5H:
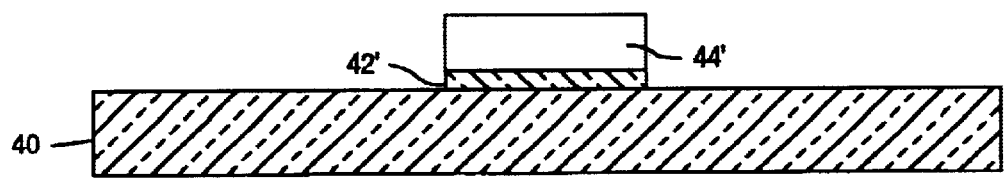

As illustrated in FIG. 5h, the anti-reflective layer portion 46' can also be removed to expose the portion 44' of the polysilicon layer 44 which functions as the gate of the field-effect transistor. This will enable direct ohmic vertical contact to the gate. The portion 46' is preferably removed using a phosphoric acid ($H_3PO_4$) solution which is conventionally used for nitride stripping.

Figure 6:
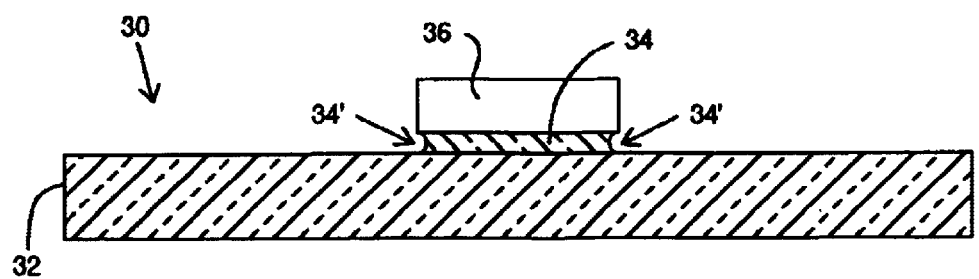
FIG. 6 is a sectional view illustrating how a gate oxide layer can be undercut in accordance with the prior art.

It will be noted in FIGS. 5g and 5h that the gate oxide layer portion 42' is not undercut as in the prior art process of FIG. 6. This is because the barrier layer portion 48' is sufficiently thin (10 to 40 angstroms) that significant undercutting of the portion 42' will not occur during the step of FIG. 5g. The length of time required to remove the portion 48' is insufficient for significant undercutting to occur.

Figure 7:
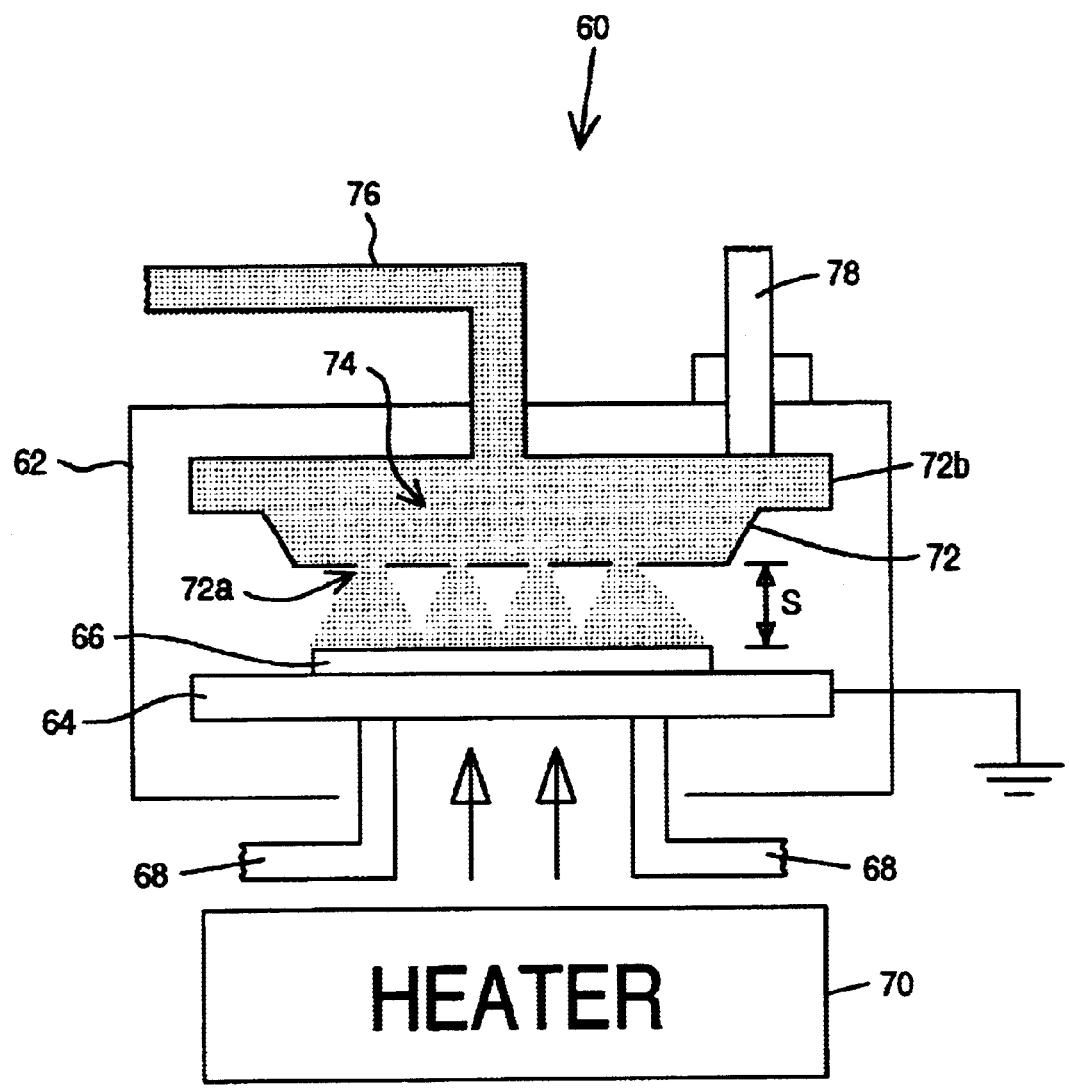
FIG. 7 is a simplified diagram illustrating a Plasma Enhanced Chemical Vapor Deposition (PECVD) apparatus for practicing the present invention.

The anti-reflective layer 46 and barrier layer 48 are preferably formed sequentially in-situ in a Plasma Enhanced Chemical Vapor Deposition (PECVD) reactor 60 which includes a container 62 as illustrated in FIG. 7. An electrically grounded susceptor 64 is suspended in the container 62. A silicon wafer 66 including one or more dies on which semiconductor structures such as illustrated in FIGS. 5a to 5h are formed is supported on the susceptor 64. Lift pins 68 are provided for placing the wafer 66 on the susceptor 64. The wafer 66 is heated to a suitable temperature by a heater 70.

A gas discharge nozzle which is known in the art as a shower head 72 is mounted in the container 62 above the wafer 66. A gas mixture 74 which is used to form the layers 46 and 48 is fed into the shower head 72 through an inlet conduit 76 and discharged downwardly toward the wafer 66 through orifices 72a.

Radio Frequency (RF) power is applied to the shower head 72 through a power lead 78. A blocker plate 72b is provided at the upper end of the shower head 72 to prevent gas from escaping upwardly. The RF power applied to the shower head 72 creates an alternating electrical field between the shower head 72 and the grounded susceptor 64 which forms a glow or plasma discharge in the gas 74 therebetween.

Preferred examples of process conditions for forming a silicon oxime anti-reflective layer 46 and silicon dioxide barrier layer 48 in a PECVD reactor such as illustrated in FIG. 7 will be presented below. In EXAMPLE I the reactor is an AMT5000 model which is commercially available from Applied Materials Corporation of Santa Clara, Calif. In EXAMPLE II the reactor is a Novellus Concept I System model which is commercially available from Novellus Systems, Inc. of San Jose, Calif.

It will be understood that these conditions are exemplary only, and that the conditions for forming these layers in a different model or type of reactor can differ substantially.

EXAMPLE I (APPLIED MATERIALS AMT5000)

The silicon oxime layer 46 is formed under the following conditions.

Silane ($SiH_4$) flow rate: 60±10 sccm

Nitrogen flow rate: 400±100 sccm

Nitrous oxide ($N_2O$) flow rate: 40±5 sccm

Pressure: 3.5±0.3 torr

RF power: 150±20 watts

Temperature: 400±10° C.

Processing time: 6±1 seconds (for 300 angstrom thickness)

Spacing (S in FIG. 7) between shower head 72 and surface of wafer 66: 460±20 mils (11.68±0.51 millimeters)

Layer thickness: 200 to 400 angstroms

After forming the silicon oxime layer 46, the container 62 is pumped down for approximately 10 seconds, and the barrier layer 48 is then grown in-situ on the layer 46. The conditions for growing the barrier layer 48 are as follows.

Nitrous oxide ($N_2O$) flow rate: 190±10 sccm

Pressure: 3.5±0.3 torr

RF power: 150±20 watts

Temperature: 400±10° C.

Processing time: 20±5 seconds

Spacing (S in FIG. 7) between shower head 72 and surface of wafer 66: 460±20 mils (11.68±0.51 millimeters)

Layer thickness: 10 to 40, more preferably 15 to 25 angstroms

EXAMPLE II (NOVELLUS CONCEPT I System)

The silicon oxime layer 46 is formed under the following conditions, all of which are variable from the listed values by approximately ±10%.

Silane (SiH$_4$) flow rate: 162 sccm
Nitrogen flow rate: 8,000 sccm
Nitrous oxide (N$_2$O) flow rate: 250 sccm
Pressure: 2.4 torr
RF power: 300 watts
Temperature: 400° C.
Processing time: 2.7 seconds
Soaktime (temperature ramp-up time): 30 seconds
Spacing (S in FIG. 7) between shower head 72 and surface of wafer 66: 550 mils (13.97 millimeters)
Layer thickness: 300 angstroms After forming the silicon oxime layer 46, the container 62 is pumped down for approximately 10 seconds, and the barrier layer 48 is then grown in-situ on the layer 46. The conditions for growing the barrier layer 48 are as follows.

Nitrous oxide (N$_2$O) flow rate: 700 sccm
Pressure: 2.4±0.3 torr
RF power: 750 watts
Temperature: 400° C.
Processing time: 15 seconds
Spacing (S in FIG. 7) between shower head 72 and surface of wafer 66: 550 mils (13.97 millimeters)
Soaktime (temperature ramp-up time): 30 seconds
Layer thickness: 20 angstroms As described in the above referenced U.S. Pat. No. 5,710,067, the increasing demands for accurate fine line patterns, minimal interwiring spacings, and reliable interlayer contacts and vias, require expansion of the capabilities, and improvements in the accuracy, of photolithographic techniques. The limitations on desirably minimal dimensions of conductive patterns imposed by photolithographic technology can be overcome by the development of materials having improved optical characteristics and etch characteristics such as high etch selectivity with respect to dielectric materials conventionally employed in the manufacture of semiconductor devices. After extensive investigation and experimentation, we developed a new compound comprising silicon, oxygen, nitrogen and hydrogen, which is quite different from the conventional silicon nitride and silicon oxynitride materials, such as those typically employed in ARCs. The new compound differs from conventional silicon oxynitride material in several ways, including structural, physical, optical and chemical characteristics.

The new compound of the present invention differs structurally from conventional silicon oxynitride material in that the silicon atoms are bonded directly to the nitrogen atoms, while the oxygen atoms are bonded to the nitrogen atoms. The compound, which contains essentially no bonding between silicon and oxygen atoms, is characterized by the formula $Si_{(1-x+y+z)}NxO:H_z$. We call this compound silicon oxime.

Figure 1:
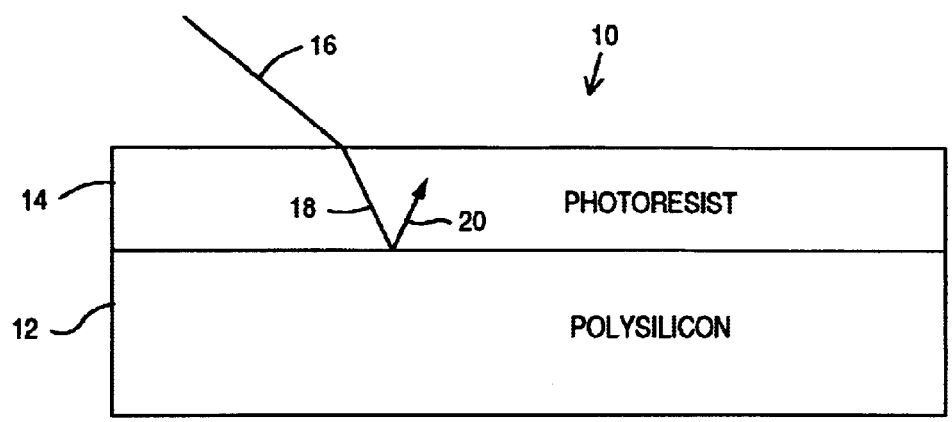
FIG. 1 is a diagram illustrating how resolution in a photolithographic process is degraded by reflection from a material layer being patterned.

A typical FT-IR spectrum of the silicon oxime of the present invention is shown in FIG. 1 and is characterized by a Si—N peak (10) of high intensity at about 840 cm$^{-1}$ and the absence of an Si—O peak. A Si—H peak (11) of very low intensity is observed at about 2145 cm$^{1}$, and an insignificant discontinuity is seen at about 1095 cm$^{-1}$ in the area of Si—O.

Figure 2:
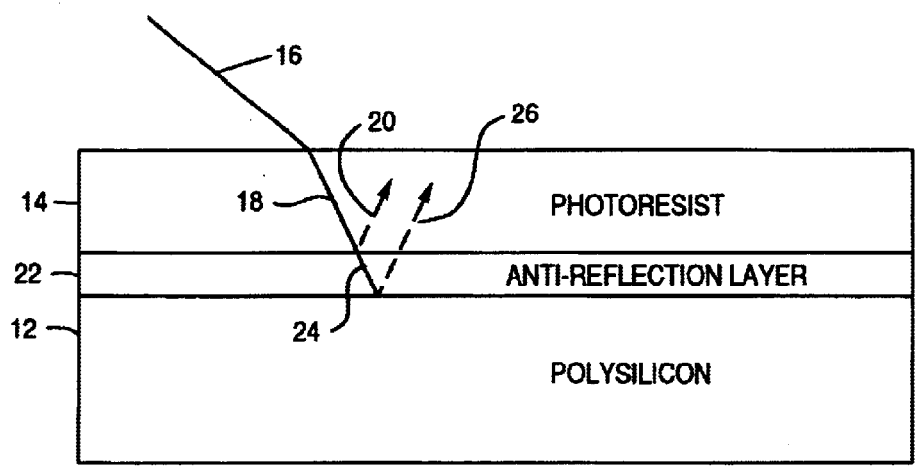
FIG. 2 is a diagram illustrating how the reflections are inhibited by an anti-reflective coating.
Figure 8:
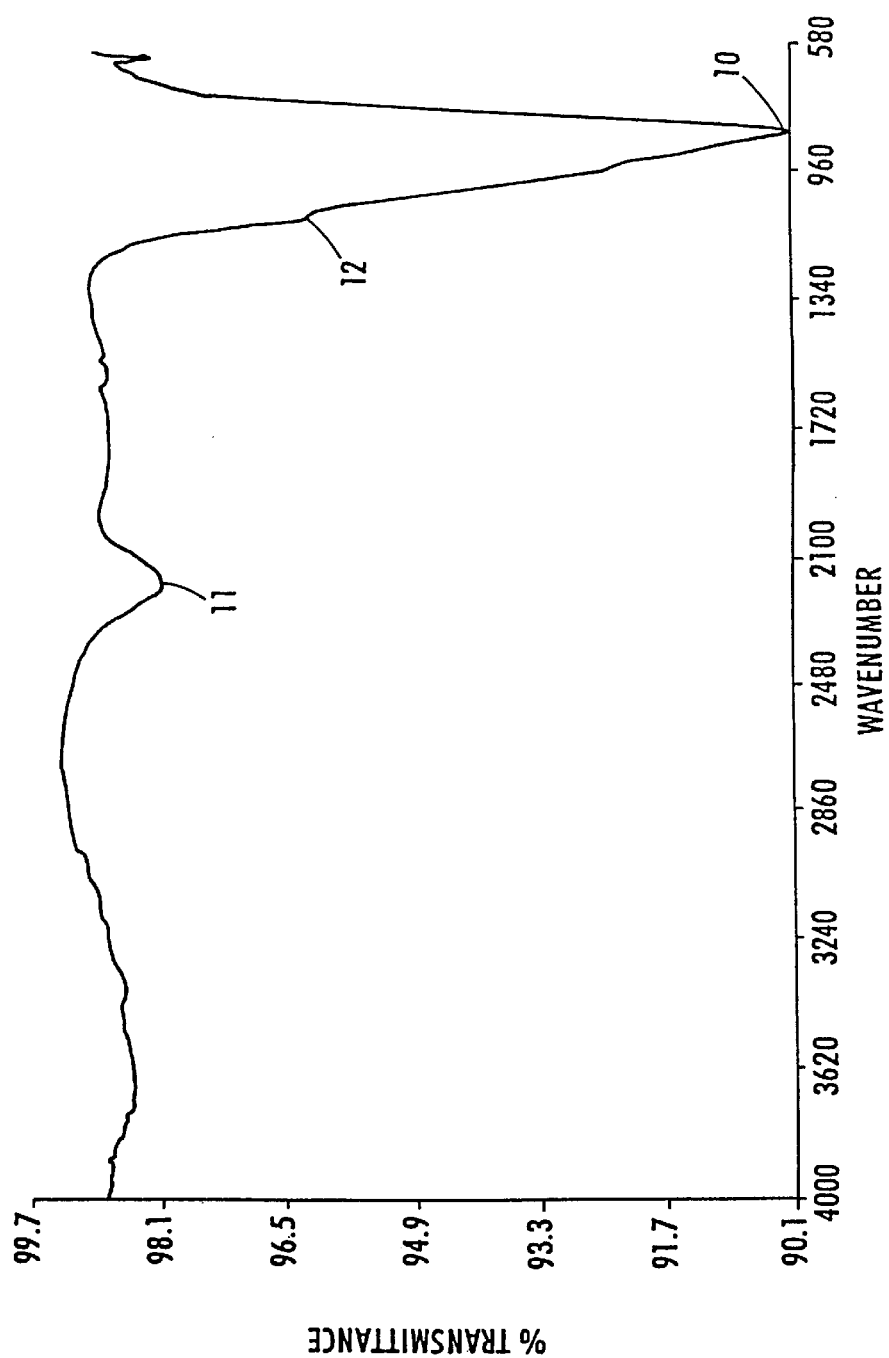
FIG. 8 is a Fourier Transform-Infrared (FT-IR) spectrum of silicon oxime in accordance with the present invention.
Figure 9:
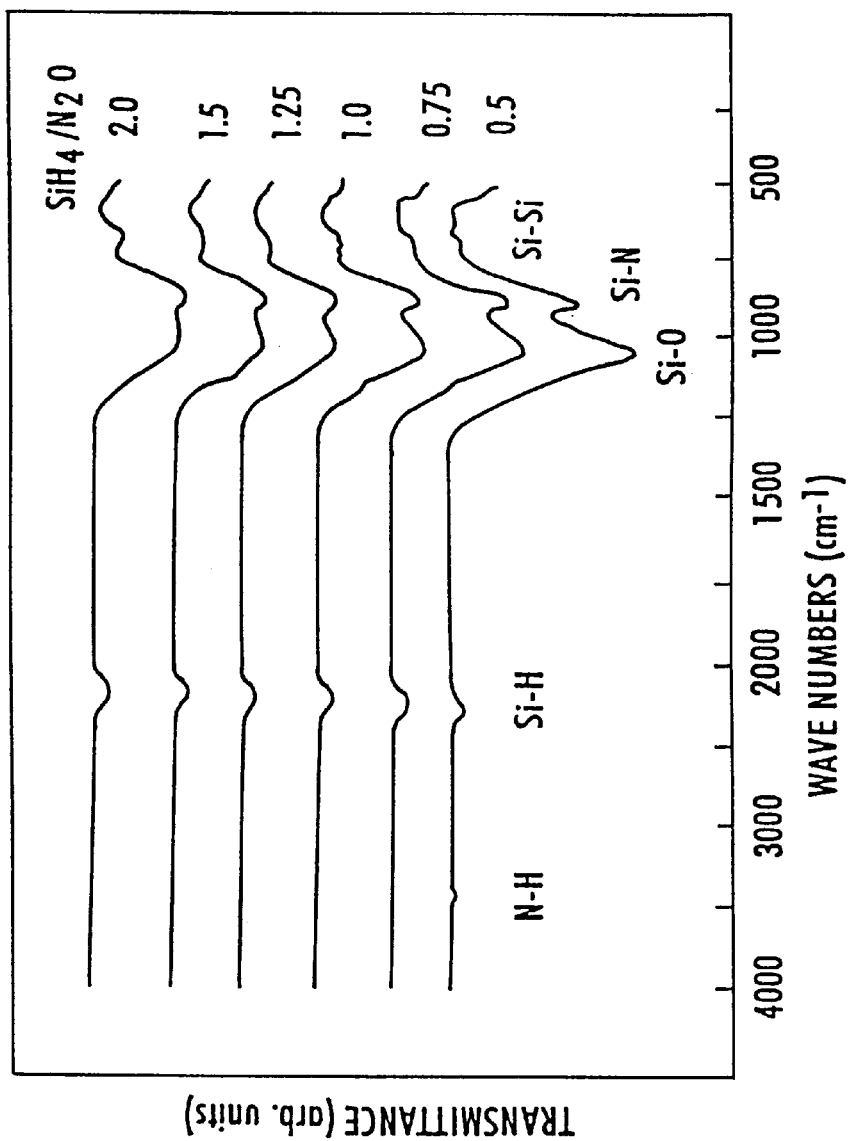
FIGS. 9 and 10 are FT-IR spectra of conventional silicon oxynitride materials.
Figure 10:
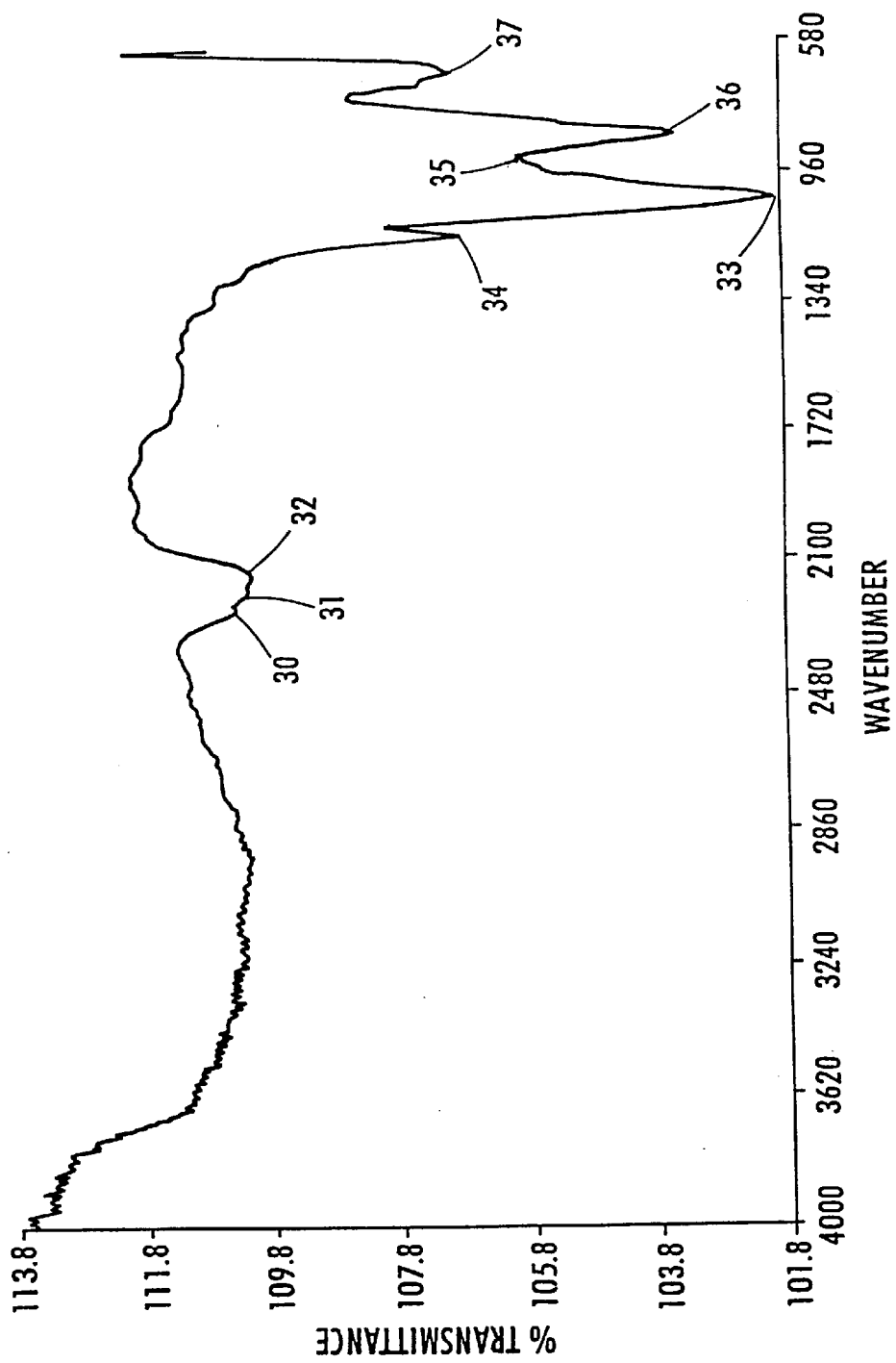
Figure 11:
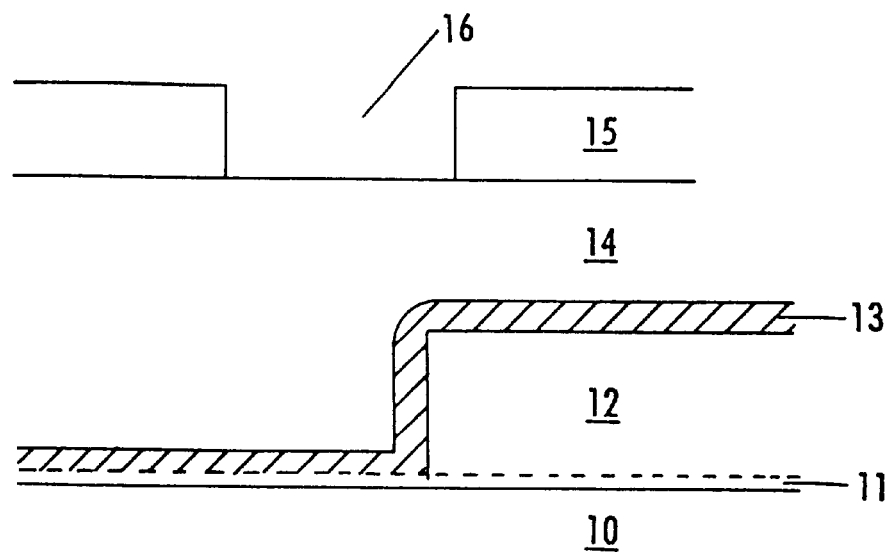
FIGS. 11 and 12 depict the use of a silicon oxime film in accordance with the present invention as an ARC in forming a via.
Figure 12:
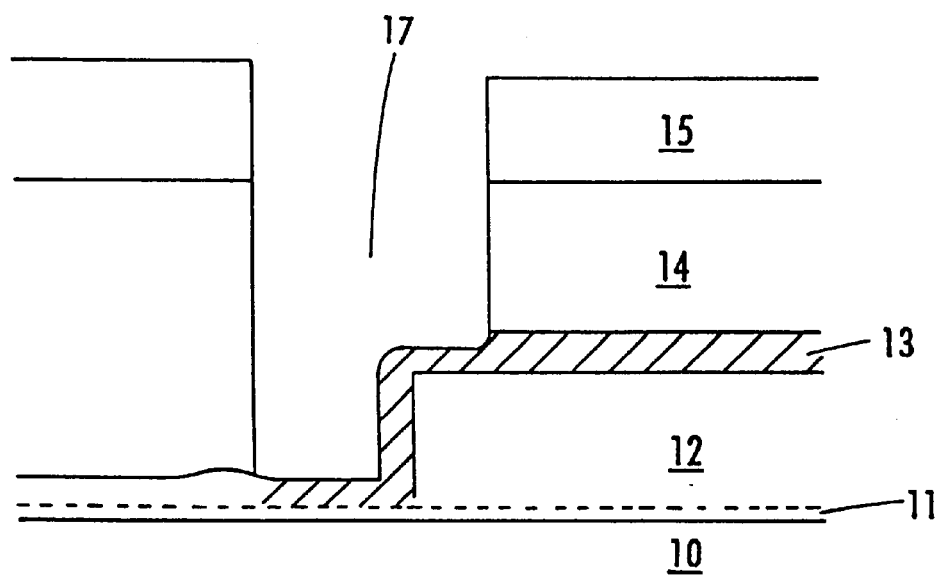

FIG. 2 depicts the FT-IR spectra of $Si_{(1-x+y+z)}NxO:H_z$ films deposited using various SiH$_4$/N$_2$O ratios, reported by Gocho et al. in the Japan Journal of Applied Physics, Vol. 33, 1994, FIG. 8, at page 488. These compounds are characterized by significant Si—O peaks at about 1030 cm$^{-1}$ of varying intensity depending upon the SiHy/N$_2$O ratio employed.

Figure 3:
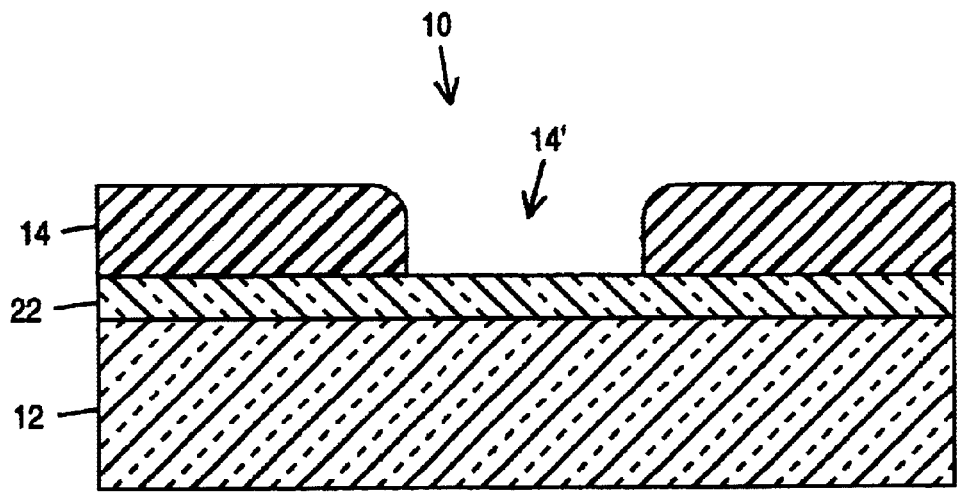
FIG. 3 is a sectional view illustrating a patterned photoresist layer.

FIG. 3 shows the FT-IR spectrum of a sample supplied by Fujitsu. This compound is characterized by Si—H peaks (30, 31, 32) at about 2223 cm$^{-1}$, about 2180 cm$^{-1}$ and about 2141 cm$^{-1}$, respectively, of relatively weak intensity, a Si—O peak (33) at about 1037 cm$^{-1}$ of high intensity, a significant Si—O peak (34) at about 1133 cm$^{-1}$ of low intensity; and Si—N peaks (35, 36) at about 941 cm$^{-1}$ and about 849 cm$^{-1}$, respectively, of relatively high intensity. An unidentified peak (37) is observed at about 659 of moderate intensity.

A comparison of FIGS. 1, 2, 3 shows that the silicon oxime of the present invention is characterized by the substantial absence of an Si—O peak and, therefore, the substantial absence of bonding between Si atoms and oxygen atoms. The silicon oxime of the present invention is, therefore, properly characterized by the formula $Si_{(1-x+y+z)}NxO:H_z$.

The silicon oxime of the present invention, particularly when formed as a thin film or layer, exhibits properties, particularly optical properties, which are significantly superior to those of silicon nitride and silicon oxynitride films conventionally employed as ARCs in the manufacture of semiconductor devices. Although emphasis is placed herein upon the manufacture of semiconductor devices, the silicon oxime of the present invention exhibits advantageous properties which render it useful in various applications in different technologies, apart from the manufacturer of semiconductor devices.

It has been found that the silicon oxime of the present invention can advantageously be formed into an effective ARC having a desirably low light reflectivity at a thickness considerably less than the thickness required of conventional ARCs comprising silicon nitride or silicon oxynitride materials to achieve a similar light reflectivity. Accordingly, the use of an ARC comprising the silicon oxime of the present invention enhances miniaturization as well as manufacturing speed.

It has also been found that the silicon oxime of the present invention is resistant to dry plasma etches which would normally etch silicon oxide. This advantageous etch characteristic renders the silicon oxime of the present invention particularly suitable as an etch stop material in various phases during the manufacture of semiconductor devices to improve dimensional accuracy. It has also been found that the silicon oxime of the present invention can be stripped with hot phosphoric acid like silicon nitride; whereas, silicon oxynitride and silicon oxide are resistant to hot phosphoric acid. Accordingly, the silicon oxime of the present invention can be advantageously employed during processing and stripped from a dielectric layer without any significant damage to the dielectric layer. The foregoing desirable optical properties and etch characteristics also render the silicon oxime of the present invention useful in various technologies wherein silicon nitride and/or silicon oxynitride have previously been employed, apart from the manufacture of semiconductor devices.

Silicon oxime, according to the present invention, can be produced by reacting source gases for the components, i.e., silicon, nitrogen, oxygen and hydrogen, under dynamic conditions employing a stoichiometric excess amount of nitrogen, sufficient to substantially prevent oxygen atoms from reacting with silicon atoms. The stoichiometric excess amount of nitrogen can be easily determined in a particular situation. Preferably, the amount of nitrogen is at least ten times the amount of oxygen present during reaction. In forming silicon nitride by PECVD, it is preferred to conduct the deposition under steady state conditions in a nitrogen-rich atmosphere.

In a preferred embodiment, silicon oxime is formed by reactive deposition under dynamic conditions employing a conventional PECVD reactor, such as that typically employed to deposit silicon oxynitride. However, the conditions under which the reaction is conducted differ from the conditions conventionally employed to deposit silicon oxynitride. Typically, silicon oxynitride (SiON:H) is deposited under equilibrium conditions in a PECVD reactor. However, in accordance with the present invention, silicon oxime is produced during the non-equilibrium conditions that exist at the on-set of a glow discharge in the PECVD reactor, employing a stoichiometric excess amount of nitrogen to substantially prevent bonding between silicon and oxygen atoms. In a preferred aspect of this embodiment, reactive deposition of silicon oxime in a PECVD reactor is conducted in a nitrogen atmosphere to effectively preclude bonding of silicon and oxygen atoms. The temperature employed for the reaction can range from about 275° C. to about 475° C., preferably about 350° C. to about 450° C. The pressure employed during the deposition reaction can range from about 1 to about 10 Torr, preferably about 2 to about 3 Torr. Conventional PECVD equipment can be employed to produce the silicon oxime of the present invention by reactive deposition.

In accordance with the present invention, silicon oxime can be formed, preferably by a deposition in the PECVD reactor, as a film or layer on a substrate. The thickness of the film or layer of silicon oxime deposited in the PECVD reactor depends upon, inter alia, the duration of deposition. As the deposition of time increases, the amount of silicon oxime formed by reactive deposition increases. Thus, in accordance with the present invention, silicon oxime can be advantageously formed as a thin film or in any desirable configuration for a desired utility depending upon, inter alia, the shape of the substrate and duration of deposition of the intended application rather of the resulting compound, and removed from the substrate if desired, as by etching the substrate.

EXAMPLE

A silicon oxime film was formed by PECVD in a conventional PECVD reactor under the following conditions:

| | |
|---|---|
| temperature | 400° C. |
| pressure | 2.5 Torr |
| power | 190 watts |
| Gap | 425 mils |
| $SiH_4$ | 50–60 sccm |
| $N_2O$ | 35–45 sccm |
| $N_2$ | 500 sccm |

Under the above conditions, the deposition rate was about 75–85 Å/sec. and the uniformity measured at 1 to 2%, 1σ. Upon analysis, the silicon oxime was found to contain about 15 to about 20 atom percent oxygen, and about 10% to about 20 atom percent hydrogen. A silicon oxime film formed under the above conditions displays absorption characteristics at 365 nm very different from conventional silicon oxynitride films. For example, a silicon oxime film having a thickness of about 350 Å to about 400 Å on polysilicon exhibits a reflectivity of about 1 to 5%; whereas, in order to achieve the same level of reflectivity, i.e., about 1 to about 5%, a conventional silicon oxynitride film requires a thickness of about 700 Å to about 1100 Å.

It was unexpectedly found that in accordance with the present invention, a silicon oxime film having a low reflectivity suitable for use an ARC can be formed by PECVD at a thickness considerably less than that required for a conventional silicon oxynitride ARC of equivalent light reflectivity. Moreover, silicon oxime films in accordance with the present invention can be formed quite rapidly. The formation of an effective silicon oxime ARC having a thickness of about 400 Å on a polysilicon substrate required about 3 to about 5 seconds.

The ability to utilize a relatively thin ARC, formed in a short period of time, advantageously facilitates increased densification and increases production throughput. Thus, the use of a silicon oxime ARC in accordance with the present invention enables the obtainment of accurate fine line conductive patterns, with interwiring spacings less than 0.3 microns, preferably less than 0.2 microns. In accordance with the present invention, an effective silicon oxime ARC is rapidly obtained with a thickness less than that of conventional silicon oxynitride ARCs having similar light reflectivities. The complex refractive index of a silicon oxime ARC of the present invention, as with other ARCs, comprises a real part n and an imaginary part k, which can be optimized in a conventional manner to achieve desired optical properties.

A silicon oxime ARC in accordance with the present invention can be deposited on conductive and nonconductive layers comprising materials conventionally employed in the semiconductor industry. Such materials may comprise polysilicon, aluminum and alloys thereof such as aluminum-silicon alloys, refractory metals, such as tungsten, refractory metal alloys, such as titanium-tungsten, refractory metal compounds, and dielectric materials. The conductive layer may also comprise a plurality of conductive layers as conventionally employed in the manufacture of semiconductor devices. For example, the conductive layer may comprise a barrier layer for enhanced adhesion to the substrate. Such barrier layers may comprise titanium, titanium nitride or titanium-titanium nitride. A layer of conductive material, such as one of the aforementioned conductive materials, e.g., aluminum or tungsten, is formed on the barrier layer. A preferred embodiment of the present invention comprises manufacturing a semiconductor device having accurately formed fine dimensions, such as fine line patterns, interwiring spacings, vias, trenches, and contact holes, by processing stages which comprise depositing a silicon oxime film. In a preferred aspect, a silicon oxime ARC is deposited on a conductive layer or an insulating layer, and a layer of photoresist material deposited thereon. The photoresist material is imagewise exposed through a photomask defining a desired conductive pattern, and developed. Etching is then conducted, using the developed photoresist as a mask, to form the conductive pattern comprising a plurality of accurately formed fine patterns with minimal interfeature spacing therebetween, such as less than about 0.5 microns. Advantageously, the silicon oxime ARC of the present invention can be employed in various photolithographic techniques, including deep ultra-violet, ion beam, I-line, $K_rF$ and $A_rF$ excimer laser lithography, to obtain accurate patterns having minimal dimensions, thereby improving miniaturization and production throughput.

The various semiconductor processing phases in which the silicon oxime film of the present invention is used involves otherwise conventional equipment, materials, and techniques, such as conventional etching techniques, preferably dry etching and high density plasma etching, using gases typically employed in standard dielectric etching systems.

Figure 4:
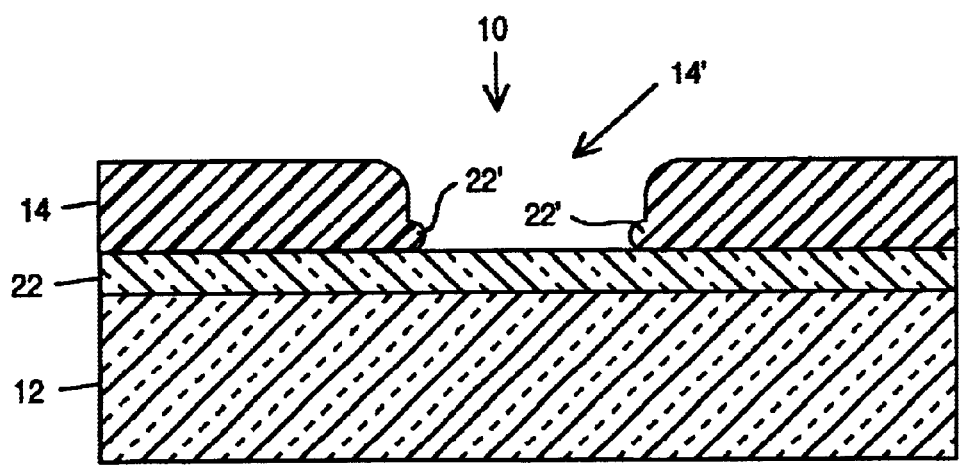
FIG. 4 is similar to FIG. 3, but illustrates a patterned photoresist layer having a lower portion which is distorted by footing.

The silicon oxime ARC of the present invention can be employed in various phases of semiconductor processing in which ARCs are conventionally employed, particularly over a step which normally presents an accuracy problem in fine line photolithography. As shown in FIG. 4, in manufacturing a semiconductor device containing a field effect transistor, a gate oxide film 11 is formed on a semiconductor substrate 10, and a gate electrode 12, typically of polysilicon, is formed on gate oxide film 11. In accordance with the present invention, a silicon oxime film is deposited on gate electrode 12 and gate oxide 11 in a region in which a contact is to be formed. A layer of dielectric material 14 is then deposited. Suitable dielectric materials include silicon dioxide, preferably derived from deposited tetraethyl orthosilicate (TEOS), or boron-phosphorous glass (BPSG), a silicon glass doped with boron and phosphorous. A layer of photoresist material 15 is then deposited, imagewise exposed, and developed to form a mask opening 16 through which etching is conducted to form contact 17, shown in FIG. 5. The use of a silicon oxime ARC enables the formation of contacts having accurate fine dimensions over a stepped region. Advantageously, the subsequent removal of the silicon oxime film which functions as an etch stop layer over polysilicon and the gate oxide region can easily be achieved with hot phosphoric acid since the etch rate of the silicon oxime is very significantly faster than the polysilicon or silicon oxide film.

Another aspect of the present invention comprises depositing a layer of silicon oxime on a dielectric material, such as silicon dioxide, for contact printing with an I-line or deep UV photoresist material.

The unique etch characteristics of silicon oxime render it useful in forming etch stop layers during various phases of semiconductor manufacturing. For example, silicon oxime exhibits high resistance to conventional dry plasma etching, including etch recipes comprising freons and freons with inert gases. It has been found that the dry plasma etchability of silicon oxime is only 10% of $SiO_2$; whereas, the etchability silicon nitride is about 50% to about 60% of $SiO_2$ while the etchability conventional silicon oxynitride is about 70% to about 75% of $SiO_2$. Therefore, a silicon oxime film formed in accordance with the present invention can advantageously be employed as an etch stop material to prevent substantial attack of underlying layers.

The above-noted exemplified utilities of silicon oxime formed in accordance with the present invention is not to be considered limiting, nor is the utility of such silicon oxime confined to ARCs or to the manufacture of semiconductor devices. The silicon oxime of the present invention can be employed in various technologies wherein silicon nitride and silicon oxynitride have heretofore been employed. For example, the silicon oxime of the present invention can be employed in the fabrication of optical waveguides, and masks for X-ray lithography.

In accordance with the present invention, a novel silicon oxime material and method of formation have been developed. Silicon oxime films are particularly useful during various phases in the manufacture of semiconductor devices. For example, silicon oxime ARCs exhibit advantageous optical characteristics enabling the accurate formation of accurate fine patterns having minimal features and spacings, such as less than about 0.3 microns, preferably less than about 0.2 microns. The uniquely desirable etch characteristics of silicon oxime enable its use as an etch stop layer to protect underlying layers or materials. Silicon oxime can also be stripped without adversely significantly damaging an underlying dielectric layer.

In summary, the present invention overcomes the drawbacks of the prior art by providing a process by which a thin silicon dioxide barrier layer can be formed on a silicon oxime, silicon oxynitride, or silicon nitride anti-reflective layer. A barrier layer formed in accordance with the present invention is thick enough to inhibit interaction between the anti-reflective layer and an-overlying photoresist layer and thereby prevent footing, but thin enough to be removed without causing undercutting of a gate oxide layer.

The present barrier layer is not formed by deposition as in the prior art. Instead, the barrier layer is grown by bombardment of the anti-reflective layer by ion species from the nitrous oxide plasma such that a portion of the surface of the anti-reflective layer is consumed by the reaction and converted into silicon dioxide. This enables the barrier layer to be grown to a thickness on the order of 10 to 40 (more preferably 15 to 25) angstroms, which is substantially thinner than can be formed by deposition of silicon dioxide (100 angstroms or more).

Various modifications will become possible for those skilled in the art after receiving the teachings of the present disclosure without departing from the scope thereof.

What is claimed is:

1. A process for forming an anti-reflective coating on a semiconductor structure, comprising the steps of:
    (a) forming an anti-reflective layer of a material selected from the group consisting of silicon oxime, silicon oxynitride, and silicon nitride on the structure; and
    (b) growing a barrier layer on the anti-reflective layer using a nitrous oxide plasma discharge to convert a surface portion of the anti-reflective layer into silicon dioxide.

2. A process as in claim 1, in which steps (a) and (b) are performed sequentially in-situ.

3. A process as in claim 1, in which:
    step (a) comprises depositing the anti-reflective layer on the structure using Plasma Enhanced Chemical Vapor Deposition (PECVD) in a reactor; and
    step (b) comprises growing the barrier layer in the reactor in-situ.

4. A process as in claim 1, in which step (b) comprises growing the barrier layer to a thickness of approximately 10 to 40 angstroms.

5. A process as in claim 1, in which step (b) comprises growing the barrier layer to a thickness of approximately 15 to 25 angstroms.

6. A process as in claim 1, in which step (a) comprises forming the anti-reflective layer such that an index of refraction, extinction coefficient and thickness thereof are optimized for ultraviolet lithography.

7. A process as in claim 1, in which step (a) comprises forming the anti-reflective layer such that an index of refraction, extinction coefficient and thickness thereof are optimized for deep ultraviolet lithography.

8. A process as in claim 7, in which step (a) comprises forming the anti-reflective layer to a thickness of approximately 200 to 400 angstroms.

9. A process as in claim 1, in which step (b) comprises growing the barrier layer in a Plasma Enhanced Chemical Vapor Deposition (PECVD) reactor with a nitrous oxide flow rate of approximately 190±10 sccm and an RF power of approximately 150±20 watts.

10. A process as in claim 9, in which step (b) comprises growing the barrier layer at a pressure of approximately 3.5±0.3 torr, and a spacing between a PECVD shower head and the surface of the anti-reflective layer of approximately 9.5 millimeters.

11. A process for applying photoresist onto a semiconductor structure, comprising the steps of:

(a) forming an anti-reflective layer of a material selected from the group consisting of silicon oxime, silicon oxynitride, and silicon nitride on the structure;

(b) growing a barrier layer on the anti-reflective layer using a nitrous oxide plasma discharge to convert a surface portion of the anti-reflective layer into silicon dioxide; and (c) applying a photoresist layer over the barrier layer.

12. A process as in claim 11, in which:

step (a) comprises depositing the anti-reflective layer on the structure using Plasma Enhanced Chemical Vapor Deposition (PECVD) in a reactor; and step (b) comprises growing the barrier layer in the reactor in-situ.

13. A process as in claim 11, in which step (b) comprises growing the barrier layer to a thickness of approximately 10 to 40 angstroms.

14. A process as in claim, 11, in which step (b) comprises growing the barrier layer to a thickness of approximately 15 to 25 angstroms.

15. A process as in claim 11, in which step (a) comprises forming the anti-reflective layer such that an index of refraction, extinction coefficient and thickness thereof are optimized for deep ultraviolet lithography.

16. A process as in claim 11, further comprising the step of:

(d) photolithographically patterning the anti-reflective layer to have an opening through which a portion of the barrier layer is exposed.

17. A process for patterning a material layer on a semiconductor structure, comprising the steps of:

(a) forming an anti-reflective layer of a material selected from the group consisting of silicon oxime, silicon oxynitride, and silicon nitride on the material layer;

(b) growing a barrier layer on the anti-reflective layer using a nitrous oxide plasma discharge to convert a surface portion of the anti-reflective layer into silicon dioxide;

(c) applying a photoresist layer over the barrier layer;

(d) photolithographically patterning the anti-reflective layer to have an opening through which a portion of the barrier layer is exposed; and (e) removing said portion of the barrier layer and an underlying portion of the material layer by exposing the structure to a substance which has a higher removal rate for the barrier layer and the material layer than for the photoresist layer.

18. A process as in claim 17, in which:

step (a) comprises depositing the anti-reflective layer on the structure using Plasma Enhanced Chemical Vapor Deposition (PECVD) in a reactor; and step (b) comprises growing the barrier layer in the reactor in-situ.

19. A process as in claim 17, in which step (b) comprises growing the barrier layer to a thickness of approximately 10 to 40 angstroms.

20. A process as in claim 17, further comprising the steps of:

(f) removing the photoresist layer; and (g) removing the barrier layer.

21. A process as in claim 20, in which step (g) comprises exposing the structure to hydrofluoric acid.

22. A process as in claim 21, in which step (g) further comprises exposing the structure to a Sulfuric Peroxide Mixture (SPM).

23. A process as in claim 20, further comprising the step of:

(h) removing the anti-reflective layer.

* * * * *